(12) United States Patent
Zaka et al.

(10) Patent No.: US 9,711,513 B2
(45) Date of Patent: Jul. 18, 2017

(54) SEMICONDUCTOR STRUCTURE INCLUDING A NONVOLATILE MEMORY CELL AND METHOD FOR THE FORMATION THEREOF

(71) Applicant: GLOBALFOUNDRIES Inc., Grand Cayman (KY)

(72) Inventors: Alban Zaka, Dresden (DE); Sven Beyer, Dresden (DE); Tom Herrmann, Dresden (DE); El Mehdi Bazizi, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/918,048

(22) Filed: Oct. 20, 2015

(65) Prior Publication Data

US 2017/0047336 A1 Feb. 16, 2017

Related U.S. Application Data

(60) Provisional application No. 62/205,221, filed on Aug. 14, 2015.

(51) Int. Cl.
| | | |
|---|---|---|
| *H01L 27/12* | (2006.01) | |
| *H01L 27/11524* | (2017.01) | |
| *H01L 27/11529* | (2017.01) | |
| *H01L 21/28* | (2006.01) | |

(52) U.S. Cl.
CPC .. *H01L 27/11524* (2013.01); *H01L 21/28273* (2013.01); *H01L 27/11529* (2013.01)

(58) Field of Classification Search
None
See application file for complete search history.

(56) References Cited

U.S. PATENT DOCUMENTS

| | | | | | |
|---|---|---|---|---|---|
| 5,455,792 | A * | 10/1995 | Yi | ......... | H01L 29/7885 257/316 |
| 5,883,409 | A * | 3/1999 | Guterman | ........... | G11C 11/5621 257/316 |
| 6,570,213 | B1 * | 5/2003 | Wu | ......... | H01L 27/115 257/314 |
| 6,747,310 | B2 * | 6/2004 | Fan | ................... | H01L 27/11521 257/316 |
| 7,009,244 | B2 * | 3/2006 | Jenq | ................. | H01L 21/28273 257/316 |

(Continued)

*Primary Examiner* — Michael Lebentritt
(74) *Attorney, Agent, or Firm* — Amerson Law Firm, PLLC (57) ABSTRACT

A semiconductor structure includes a nonvolatile memory cell including a source region, a channel region and a drain region that are provided in a semiconductor material. The channel region includes a first portion adjacent the source region and a second portion between the first portion of the channel region and the drain region. An electrically insulating floating gate is provided over the first portion of the channel region. The nonvolatile memory cell further includes a select gate and a control gate. The first portion of the select gate is provided over the second portion of the channel region. The second portion of the select gate is provided over a portion of the floating gate that is adjacent to the first portion of the select gate. The control gate is provided over the floating gate and adjacent to the second portion of the select gate.

15 Claims, 6 Drawing Sheets

(56) References Cited

U.S. PATENT DOCUMENTS

| | | | | |
|---|---|---|---|---|
| 7,045,848 B2* | 5/2006 | Shukuri | ............... | B82Y 10/00 257/311 |
| 7,259,423 B2* | 8/2007 | Min | ............... | H01L 27/115 257/314 |
| 7,602,008 B2* | 10/2009 | Kang | ............... | H01L 29/7887 257/319 |
| 7,652,318 B2* | 1/2010 | Hsieh | ............... | H01L 27/115 257/314 |
| 7,667,259 B2* | 2/2010 | Yasui | ............... | H01L 27/115 257/314 |
| 7,868,375 B2 | 1/2011 | Liu et al. | | |
| 8,669,607 B1* | 3/2014 | Tsair | ............... | H01L 29/7881 257/316 |
| 8,928,060 B2* | 1/2015 | Tsair | ............... | H01L 27/11517 257/316 |
| 9,018,690 B2* | 4/2015 | Tadayoni | ............... | H01L 21/28273 257/315 |
| 9,082,865 B2* | 7/2015 | Yu | ............... | H01L 29/788 |
| 9,236,453 B2* | 1/2016 | Li | ............... | H01L 29/7881 |
| 2004/0000688 A1* | 1/2004 | Harari | ............... | H01L 27/11553 257/315 |
| 2006/0008983 A1* | 1/2006 | Yeh | ............... | H01L 21/28273 438/257 |
| 2015/0348985 A1* | 12/2015 | Loiko | ............... | H01L 27/11568 257/314 |

* cited by examiner

SEMICONDUCTOR STRUCTURE INCLUDING A NONVOLATILE MEMORY CELL AND METHOD FOR THE FORMATION THEREOF

BACKGROUND OF THE INVENTION

1. Field of the Invention

Generally, the present disclosure relates to the field of integrated circuits and, more particularly, to integrated circuits including nonvolatile memory devices.

2. Description of the Related Art

Nonvolatile memory, such as, for example, flash memory, can be used in various storage devices, such as, for example, secure digital memory cards (SD cards), USB sticks, solid state drives (SSDs) and internal memory of various electronic devices, such as, for example, mobile phones, tablet computers, media players, etc. Further applications of nonvolatile memory include embedded systems, wherein nonvolatile memory blocks including nonvolatile memory are provided in addition to host logic devices and wherein the nonvolatile memory devices and the logic devices are physically and electrically integrated on a single substrate, for example, a single monolithic silicon substrate. Embedded systems including nonvolatile memory find applications in various fields, such as, for example, in automotive, industry and communication market segments. Integrating nonvolatile memory and logic circuitry on a single substrate can help to improve performance and reduce costs compared to solutions wherein nonvolatile memory and logic circuitry are provided on separate substrates, for example, due to an elimination of input/output buffers, design flexibility, lower power consumption and/or system-on-a-chip capability.

Types of nonvolatile memory cell architectures that have been used in embedded systems include one transistor cells (1T-cells) including a single gate, as well as split gate solutions such as 1.5 transistor (1.5T) and 2 transistor (2T) cells.

Examples of known nonvolatile memory cells include those described in U.S. Pat. Nos. 6,747,310 and 7,868,375. Nonvolatile memory cells as described in U.S. Pat. Nos. 6,747,310 and 7,868,375 include a source region and a drain region that are formed in a semiconductor substrate. Between the source region and the drain region, a channel region is provided that is doped differently than the source region and the drain region. Over the channel region, a floating gate and a select gate are provided. Over the floating gate, a control gate is provided, and an erase gate is provided over the source region. The select gate, the floating gate, the control gate and the erase gate are electrically insulated from each other and from the source, drain and channel regions by electrically insulating materials. The floating gate can be surrounded by electrically insulating material so that it is electrically floating. The source region, the drain region, the select gate, the control gate and the erase gate can have respective electrical contacts connected thereto so that voltages can be applied to the source region, the drain region and the select, control and erase gates for performing operations of programming, erasing and reading the nonvolatile memory cell.

For programming the nonvolatile memory cell, voltages adapted for creating a relatively strong, substantially vertically oriented electrical field in the channel region between the select gate and the floating gate can be applied to the select and control gates and the source and drain regions, which can cause a hot electron injection into the floating gate so that the floating gate is electrically charged. Since the floating gate is electrically floating, the charge injected into the floating gate can remain in the floating gate and can create an electric field that acts on a portion of the channel region below the floating gate.

For reading data from the nonvolatile memory cell, a voltage can be applied between the source region and the drain region, and a voltage adapted for creating an electrically conductive channel below the select gate can be applied to the select gate. Due to the influence of the electric charge in the floating gate on the portion of the channel region below the floating gate, a current flowing between the source region and the drain region can be influenced by the electric charge of the floating gate. Thus, it can be determined if an electric charge has been injected into the floating gate by means of a programming operation.

For erasing the nonvolatile memory cell, a relatively high positive voltage can be applied to the erase gate. Thus, a Fowler-Nordheim tunneling of electrons from the floating gate to the erase gate can be obtained. Thus, an electric charge injected into the floating gate in the programming of the nonvolatile memory cell can be removed from the floating gate. The select gate can provide a separation of the floating gate from the drain which may help to substantially avoid or at least reduce an overerase phenomenon.

In known nonvolatile memory cells, the select gate, the control gate, the erase gate and the floating gate may be formed of polysilicon, and silicon dioxide, silicon nitride and/or silicon oxynitride may be used for providing an electrical insulation between the select gate, the control gate, the erase gate and the floating gate and for providing an electrical insulation between the gates and the source, drain and channel regions of the nonvolatile memory cell.

Nonvolatile memory cells as described above have been implemented in the 40 nm technology node. However, implementing nonvolatile memory cells as described above in smaller technology nodes, for example in the 28 nm technology node, may have issues associated therewith, which may be related to short channel effects at the select gate, and a relatively large amount of space that is required for providing the select gate, the control gate, the erase gate and the floating gate. Furthermore, relatively complex manufacturing processes may be required for forming known nonvolatile memory cells since a number of processes of deposition of polysilicon and chemical mechanical polishing may have to be performed for forming the select gate, the control gate, the erase gate and the floating gate. Moreover, there may be issues related to providing an appropriate electrical insulation between the gates of the nonvolatile memory cells while maintaining a good controllability of the channel region.

The present disclosure provides semiconductor structures including nonvolatile memory cells and methods for the formation thereof which may help to substantially overcome or at least reduce some or all of the above-mentioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure disclosed herein includes a nonvolatile memory cell. The nonvolatile memory cell includes a source region, a channel region and a drain region that are provided in a semiconductor material. The channel region includes a first portion adjacent the source region and a second portion between the first portion of the channel region and the drain region. An electrically insulated floating gate is provided over the first portion of the channel region but not over the second portion of the channel region. The nonvolatile memory cell further includes a select gate and a control gate. The select gate includes a first portion and a second portion. The first portion of the select gate is provided over the second portion of the channel region. The second portion of the select gate is provided over a portion of the floating gate that is adjacent to the first portion of the select gate. The control gate is provided over the floating gate and adjacent to the second portion of the select gate.

Another illustrative semiconductor structure disclosed herein includes a nonvolatile memory cell including a source region, a channel region and a drain region that are provided in a semiconductor material. The channel region includes a first portion adjacent the source region and a second portion between the first portion of the channel region and the drain region. An electrically insulated floating gate is provided over the first portion of the channel region but not over the second portion of the channel region. The nonvolatile memory cell further includes a select gate. The select gate includes a gate electrode including a metal layer and a gate insulation layer including a dielectric material having a greater dielectric constant than silicon dioxide. At least a first portion of the select gate is provided over the second portion of the channel region. A sidewall spacer is provided at a sidewall of the floating gate. The sidewall spacer is arranged between the floating gate and the first portion of the select gate. A control gate is provided over the floating gate.

An illustrative method disclosed herein includes providing a semiconductor structure that includes a semiconductor material. A layer of a floating gate material that is surrounded by at least one electrically insulating material is formed over the semiconductor material. A gate stack is formed over the semiconductor structure. The gate stack is patterned. The patterning of the gate stack forms a select gate. The select gate includes a first portion and a second portion. The first portion of the select gate is provided over a portion of the semiconductor material adjacent to the layer of floating gate material. The second portion of the select gate is provided over a portion of the layer of floating gate material adjacent to the first portion of the select gate. After the patterning of the gate stack, a control gate is formed over a portion of the layer of floating gate material adjacent to the second portion of the select gate.

Another illustrative method disclosed herein includes providing a semiconductor structure including a semiconductor material. A layer stack including one or more electrically insulating layers and a layer of floating gate material is formed over a first portion of the semiconductor material. A sidewall spacer including an electrically insulating material is formed at a sidewall of the layer stack. After the formation of the sidewall spacer, a gate stack is formed over the semiconductor structure. The gate stack is patterned. The patterning of the gate stack forms a select gate. At least a first portion of the select gate is provided over a second portion of the semiconductor material adjacent to the layer stack. After the patterning of the gate stack, a control gate is formed over a portion of the layer of floating gate material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure provides a configuration of a floating gate and a select gate in a nonvolatile memory cell, wherein the select gate has an overhang over the floating gate so that the select gate includes a first portion that is adjacent to the floating gate and a second portion that is arranged over the floating gate. Thus, the footprint of the nonvolatile memory cell may be reduced compared to nonvolatile memory cells wherein the entire select gate is arranged adjacent the floating gate, while enabling substantially the same channel control, which may help to avoid read disturbs in the reading of data from the nonvolatile memory cell.

In some embodiments, the select gate may be formed from a high-k metal gate (HKMG) gate stack, which may also be employed in the formation of gate electrodes of logic transistors. Thus, the select gate may be provided with a gate insulation layer including a high-k dielectric material having a greater dielectric constant than silicon dioxide, and a gate electrode including a metal. This may help to reduce short channel effects at the select gate, which may help to further improve the channel control at the select gate. Furthermore, forming select gates of nonvolatile memory cells and logic gates of logic transistors from a same gate stack may help to reduce the complexity of the manufacturing process since separate deposition processes need not be performed for depositing the materials of the select gates. Accordingly, the select gates of the nonvolatile memory cells and the gates of the logic transistors may be formed by performing common process operations, e.g., a common patterning process. Compared to nonvolatile memory cells wherein the select gates are formed by techniques of deposition and chemical mechanical polishing of polysilicon, forming the select gates of nonvolatile memory cells from an HKMG stack may help to save one polysilicon deposition process and one chemical mechanical polishing process. Additionally, patterning the select gates of nonvolatile memory cells and logic gates of logic transistors in a common patterning may help to avoid topography issues. The overhang of the select gate over the floating gate may allow an encapsulation of the high-k dielectric material on both sides, i.e., both above the floating gate and on the drain side. The select gates of the nonvolatile memory cells may provide wordlines of an array of nonvolatile memory cells.

The present disclosure further provides a configuration of a select gate and a floating gate wherein different thicknesses of an electrically insulating material such as, for example, silicon dioxide, are provided at a bottom of a select gate and at a sidewall of a floating gate facing the select gate. A sidewall spacer of electrically insulating material, for example, a silicon dioxide sidewall spacer, may be formed at the sidewall of the floating gate facing the select gate. A relatively thin layer of the electrically insulating material, for example, a silicon dioxide layer, which has a smaller thickness than the sidewall spacer, may be provided at the bottom of the select gate.

The sidewall spacer can increase the distance between the floating gate and the select gate compared to embodiments wherein the sidewall spacer is omitted and only a relatively thin electrically insulating layer is formed between the floating gate and the select gate. Thus, a coupling ratio between the floating gate and the select gate may be reduced. Additionally, the sidewall spacer may help to substantially prevent electrical breakdowns between the floating gate and the select gate, or at least reduce a likelihood of such electrical breakdowns occurring. Moreover, a tunneling of charge carriers between the select gate and the floating gate may be substantially avoided or at least reduced.

Furthermore, forming the sidewall spacer at the sidewall of the floating gate may allow increasing the thickness of the electrical insulation at the sidewall of the floating gate without increasing a thickness of an electrically insulating layer that is provided over the floating gate, for example, between the floating gate and an overhang of the select gate over the floating gate.

Providing only a relatively thin gate insulation layer including the relatively thin electrically insulating layer at the bottom of the select gate between a portion of the channel region below the select gate and a gate electrode provided in the select gate may help to improve the electrostatic control of the channel.

Figure 1:
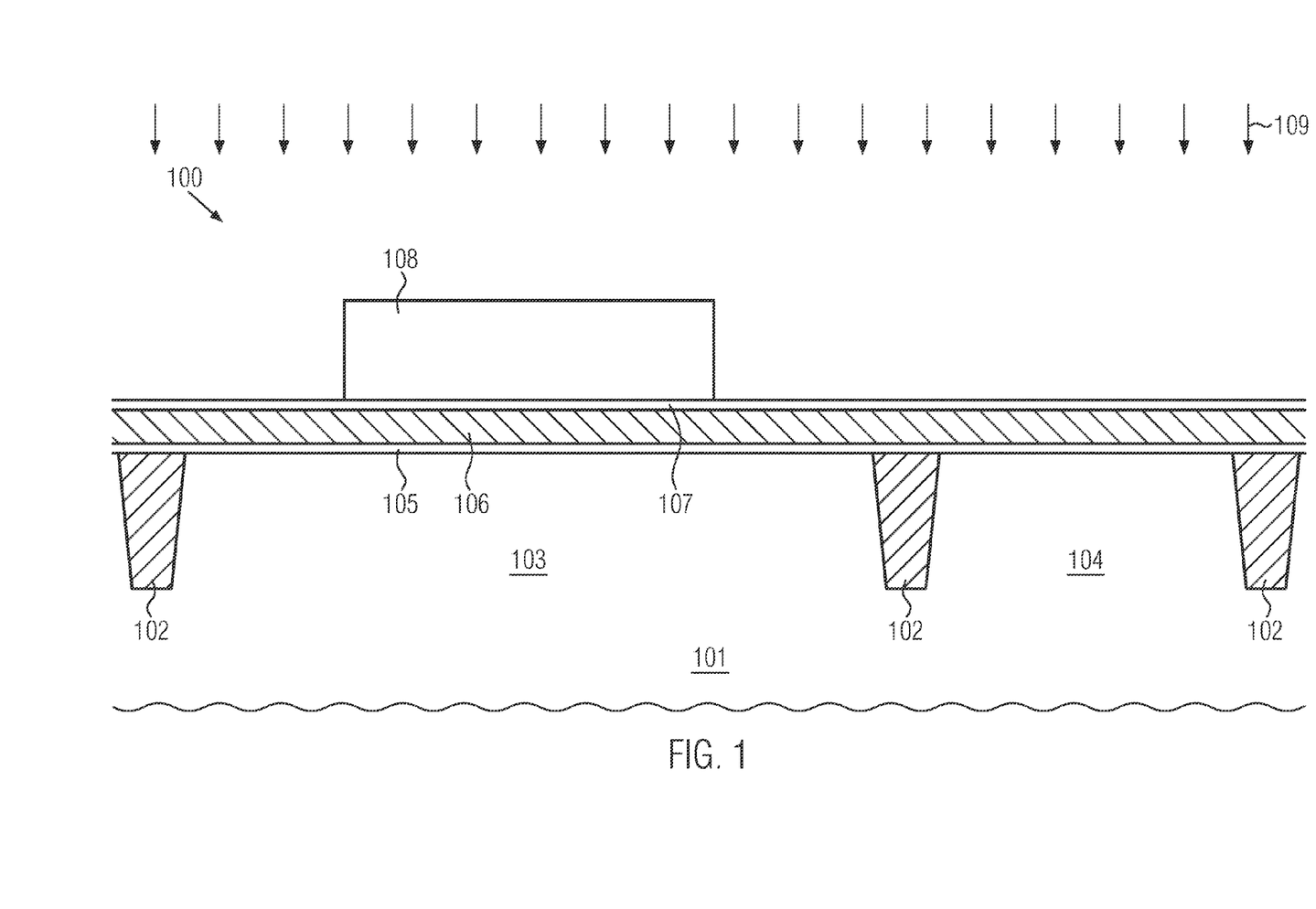
FIGS. 1-6 show schematic cross-sectional views of a semiconductor structure according to an embodiment in stages of a method of manufacturing a semiconductor structure according to an embodiment.

FIG. 1 shows a schematic cross-sectional view of a semiconductor structure 100 according to an illustrative embodiment in a stage of a method of manufacturing a semiconductor structure according to an embodiment. The semiconductor structure 100 includes a substrate 101. The substrate 101 may be a bulk semiconductor substrate formed of a semiconductor material, for example, a wafer formed of a semiconductor material such as silicon. In other embodiments, the substrate 101 may be a semiconductor-on-insulator (SOI) substrate that includes a layer of a semiconductor material such as, for example, silicon, that is provided above a support substrate, which may be a silicon wafer, and is separated from the support substrate by a layer of an electrically insulating material such as, for example, silicon dioxide.

The semiconductor structure 100 further includes a trench isolation structure 102. The trench isolation structure 102 may provide an electrical insulation between a nonvolatile memory region 103 and a logic transistor region 104. Additionally, the trench isolation structure 102 may electrically insulate the nonvolatile memory region 103 and the logic transistor region 104 from other regions (not shown) wherein circuit elements are to be formed in the semiconductor structure 100. The nonvolatile memory region 103 and the logic transistor region 104 may be provided in the semiconductor material of the substrate 101 and may be doped for providing a doping of active regions of nonvolatile memory cells and a logic transistor, respectively.

As will be detailed in the following, a pair of nonvolatile memory cells (denoted by reference numerals 617 and 618 in FIG. 6) may be formed in the nonvolatile memory region 103, and a logic transistor (denoted by reference numeral 619 in FIG. 6) may be formed in the logic transistor region 104, wherein some method steps of the manufacturing process may be used both for forming features of the nonvolatile memory cells 617, 618 and for forming features of the logic transistor 619.

Of course, the present disclosure is not limited to embodiments wherein the nonvolatile memory region 103 and the logic transistor region 104 are provided directly adjacent to each other, as shown in FIGS. 1-6. In other embodiments, the nonvolatile memory region 103 and the logic transistor region 104 may be provided at a distance to each other, and regions wherein circuit elements other than the nonvolatile memory cells 617, 618 and the logic transistor 619 are formed may be arranged between the nonvolatile memory region 103 and the logic transistor region 104. In some embodiments, the nonvolatile memory region 103 may be provided in a portion of the semiconductor structure 100 wherein a dedicated nonvolatile memory block of an integrated circuit is formed, and the logic transistor region 104 may be provided in a portion of the semiconductor structure 100 wherein a dedicated logic circuit block of the integrated circuit is formed.

The trench isolation structure 102 may be formed by means of known techniques for forming shallow trench isolation structures, which may include processes of photolithography and etching for forming trenches in the substrate 101, processes of oxidation and/or deposition for filling the trenches with an electrically insulating material such as silicon dioxide, and processes of etching and/or chemical mechanical polishing for removing portions of the electrically insulating material outside the trenches. For providing a doping of the nonvolatile memory region 103 and the logic transistor region 104, techniques of ion implantation may be used.

An electrically insulating layer 105 may be formed over the semiconductor material of the substrate 101 in the nonvolatile memory region 103 and the logic transistor region 104. In some embodiments, the electrically insulating layer 105 may be a silicon dioxide layer, and it may be formed by means of a thermal oxidation process, wherein the semiconductor structure 100 is exposed to an oxidizing ambient including water vapor and/or oxygen at an elevated temperature to oxidize the semiconductor material of the substrate 101. In other embodiments, the electrically insulating layer 105 may be formed by means of a deposition process adapted for the deposition of silicon dioxide, for example, a chemical vapor deposition (CVD) process and/or a plasma-enhanced chemical vapor deposition (PECVD) process. The electrically insulating layer 105 may have a thickness in a range from about 5-15 nm, for example, a thickness of about 8 nm.

A layer 106 of a floating gate material may be formed over the electrically insulating layer 105. In some embodiments, the layer 106 of floating gate material may include a semiconductor material, for example, polycrystalline silicon, nanocrystalline silicon and/or amorphous silicon. Techniques for the deposition of silicon, such as CVD and/or PECVD, may be used for depositing the layer 106 of floating gate material, wherein parameters of the deposition process may be adapted such that the desired crystalline structure of the deposited floating gate material is obtained. In some embodiments, the layer 106 of floating gate material may have a thickness in a range from about 10-40 nm, for example, a thickness of about 20 nm.

An electrically insulating layer 107 may be formed over the layer 106 of floating gate material. Similar to the electrically insulating layer 105, the electrically insulating layer 107 may include silicon dioxide, and it may have a thickness in a range from about 5-15 nm, for example, a thickness of about 8 nm. For forming the electrically insulating layer 107, deposition processes for the deposition of silicon dioxide, such as CVD and/or PECVD, may be used. Alternatively, a thermal oxidation process may be performed, wherein a portion of the layer 106 of floating gate material is oxidized to form the electrically insulating layer 107. In such embodiments, the layer 106 of floating gate material may initially be deposited with a slightly greater thickness to take the loss of material of the layer 106 of floating gate material that is caused by the oxidation into account.

After the formation of the electrically insulating layers 105, 107 and the layer 106 of floating gate material, the electrically insulating layers 105, 107 and the layer 106 of floating gate material may be patterned. The patterning may include a formation of a mask 108 over a portion of the nonvolatile memory region 103. The mask 108 may be a photoresist mask, and it may be formed by means of techniques of photolithography. Thereafter, one or more etch processes, which are illustrated by arrows 109 in FIG. 1, may be performed. The one or more etch processes 109 may include one or more dry etch processes, for example, reactive ion etch processes, that are adapted for removing the materials of the electrically insulating layers 105, 107 and the layer 106 of floating gate material.

Figure 2:
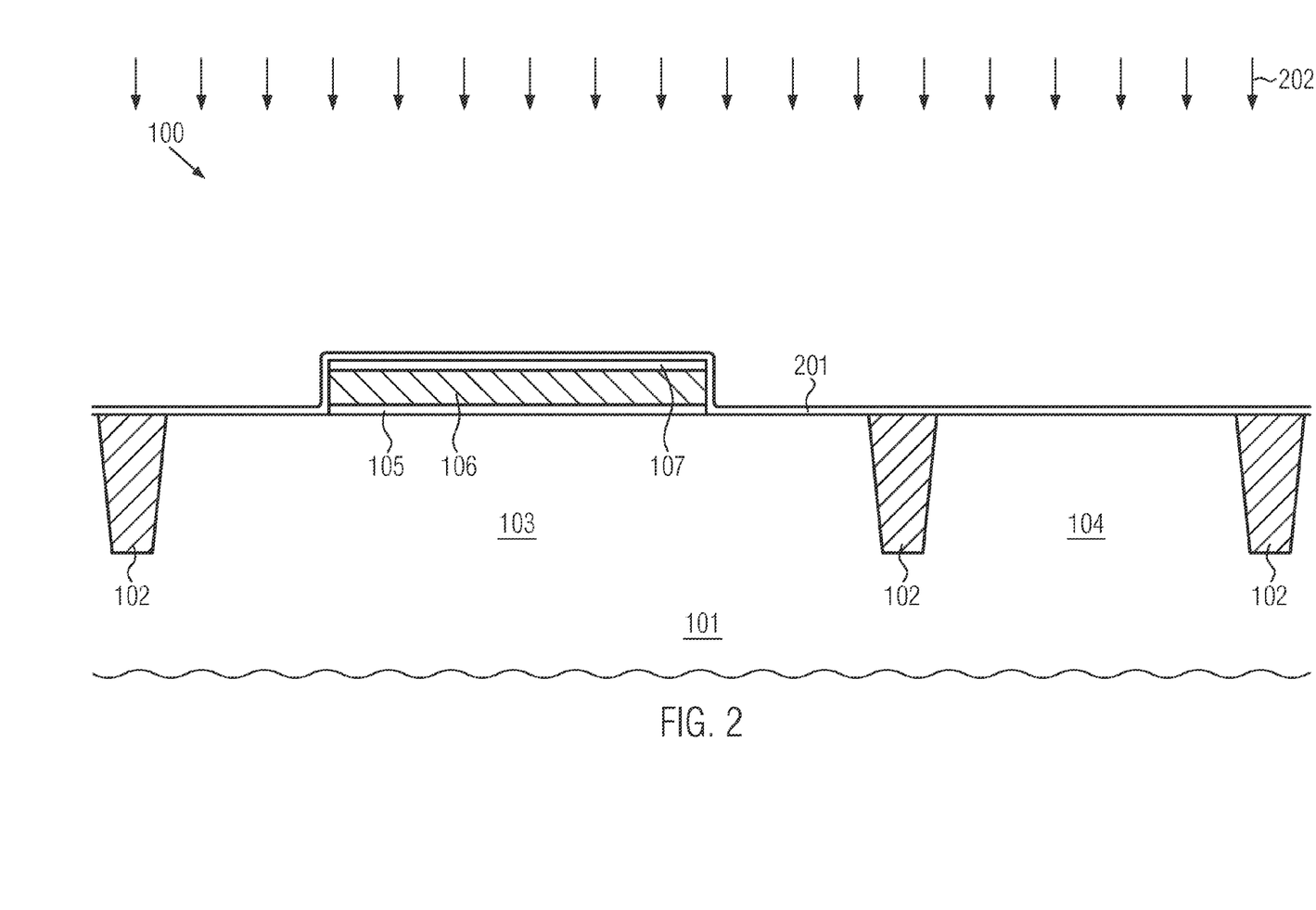

FIG. 2 shows a schematic cross-sectional view of the semiconductor structure 100 in a later stage of the manufacturing process. In the one or more etch processes 109, portions of the electrically insulating layers 105, 107 and the layer 106 of floating gate material which are not covered by the mask 108 may be removed from the semiconductor structure 100 so that the semiconductor material of the substrate 101 is exposed in the logic transistor region 104 and in portions of the nonvolatile memory region 103. Portions of the electrically insulating layers 105, 107 and the layer 106 of floating gate material that are covered by the mask 108 during the one or more etch processes 109 may remain in the semiconductor structure 100.

After the one or more etch processes 109, the mask 108 may be removed by means of a resist strip process, and an electrically insulating layer 201 may be deposited over the semiconductor structure 100. The electrically insulating layer 201 may include silicon dioxide, and it may have a thickness in a range from about 3-15 nm, for example, a thickness of about 8 nm. The electrically insulating layer 201 may be formed by means of a deposition process, such as a CVD process and/or a PECVD, process that is adapted for the deposition of silicon dioxide.

After the formation of the electrically insulating layer 201, an anisotropic etch process that is adapted for the removal of the material of the electrically insulating layer 201 may be performed. In FIG. 2, the anisotropic etch process is schematically illustrated by arrows 202. The anisotropic etch process 202 may be a dry etch process adapted for the removal of silicon dioxide, for example, a reactive ion etch process.

Figure 3:
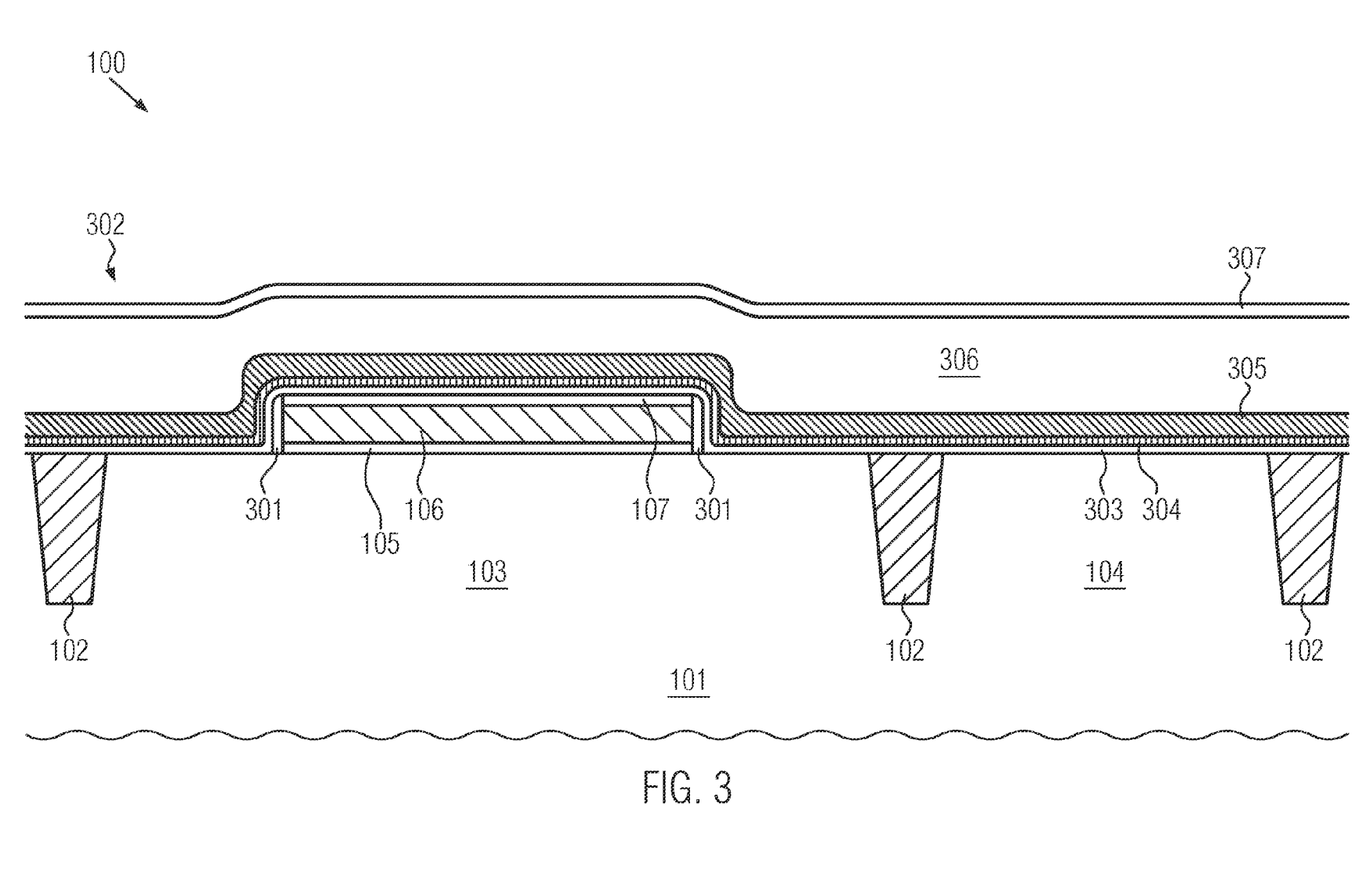

FIG. 3 shows a schematic cross-sectional view of the semiconductor structure 100 in a later stage of the manufacturing process. The anisotropic etch process 202 may remove portions of the electrically insulating layer 201 over substantially horizontal portions of the semiconductor structure 100, for example, portions of the electrically insulating layer 201 over a top surface of the layer stack formed by the electrically insulating layers 105, 107 and the layer 106 of floating gate material, and surfaces of the semiconductor material of the substrate 101 in the nonvolatile memory region 103 that are located at a distance to the layer stack. Moreover, the anisotropic etch process 202 may remove portions of the electrically insulating layer 201 over the logic transistor region 104 so that the semiconductor material of the substrate 101 is exposed in the logic transistor region 104. Due to the anisotropy of the anisotropic etch process 202, portions of the electrically insulating layer 201 at the sidewalls of the layer stack formed by the electrically insulating layers 105, 107 and the layer 106 of floating gate material may remain in the semiconductor structure and may form a sidewall spacer 301 at sidewalls of the layer stack. In particular, the sidewall spacer 301 may cover sidewalls of the layer 106 of floating gate material. Thus, the layer 106 of floating gate material is surrounded by the electrically insulating material of the electrically insulating layers 105, 107 and the sidewall spacer 301.

After the formation of the sidewall spacer 301, a gate stack 302 may be formed over the semiconductor structure 100. The gate stack 302 may include a base layer 303, a layer 304 of a high-k dielectric material, a metal layer 305, a layer 306 of a semiconductor material and a capping layer 307.

The base layer 303 may be a silicon dioxide layer, and it may have a thickness that is smaller than the thicknesses of the electrically insulating layers 105, 107 and 201. In particular, the thickness of the base layer 303 may be smaller than the thickness of the sidewall spacer 301, being an extension of the sidewall spacer 301 in a direction parallel to the surface of the substrate 101 (horizontal in the plane of drawing of FIG. 3). In some embodiments, a total thickness of the base layer 303 and the layer 304 of high-k dielectric material may also be smaller than the thickness of the sidewall spacer 301. The thickness of the sidewall spacer 301 may be approximately equal to or slightly smaller than the thickness of the electrically insulating layer 201. In some embodiments, the base layer 303 may have a thickness in a range from about 0.6-4 nm, for example, a thickness of about 1 nm. The base layer 303 may be formed by means of oxidation, chemical vapor deposition and/or plasma-enhanced chemical vapor deposition.

The layer 304 of high-k dielectric material may include a dielectric material having a greater dielectric constant than silicon dioxide. In some embodiments, the high-k dielectric material of the layer 304 may have a dielectric constant greater than 4, and in other cases greater than about 10. In some embodiments, the layer 304 of high-k dielectric material may include one or more of hafnium dioxide, zirconium dioxide, hafnium silicon oxynitride, zirconium silicon oxynitride and/or hafnium zirconium oxide. The layer 304 of high-k dielectric material may be formed by means of techniques for the deposition of high-k dielectric materials which may include atomic layer deposition, chemical vapor deposition, plasma-enhanced chemical vapor deposition and/or physical vapor deposition.

The metal layer 305 may include a metal having a workfunction that is suitable for workfunction engineering in N-channel field effect transistors such as, for example, lanthanum, lanthanum nitride and/or titanium nitride. The metal layer 305 need not be a substantially homogeneous layer. In some embodiments, the metal layer 305 may include sublayers that are formed of different metals.

The layer 306 of semiconductor material may include polysilicon, and it may be formed by means of CVD and/or PECVD. The capping layer 307 may include one or more dielectric materials such as, for example, silicon dioxide, silicon nitride and/or silicon oxynitride, and it may be formed by means of CVD and/or PECVD.

Further features of the gate stack 302 may correspond to those of gate stacks that are conventionally employed in the formation of gates of field effect transistors in accordance with high-k metal gate techniques, wherein a gate-first approach is employed. In particular, features of the gate stack 302 may correspond to features of gate stacks that are formed over portions of a semiconductor structure wherein N-channel field effect transistors are to be formed.

The present disclosure is not limited to embodiments wherein the sidewall spacer 301 is formed. In other embodiments, the formation of the electrically insulating layer 201 and the anisotropic etch process 202 may be omitted so that the sidewall spacer 301 is not formed. In such embodiments, the layer 106 of floating gate material is surrounded by the electrically insulating materials of the electrically insulating layers 105, 107, the base layer 303 and the layer 304 of high-k dielectric material. However, providing the sidewall spacer 301 may help to reduce a coupling between floating gates and select gates of nonvolatile memory cells, which may help to substantially prevent read disturbs in the reading of data from the nonvolatile memory cells. Furthermore, the sidewall spacer 301 may help to substantially prevent an electrical breakdown between the floating gate and the select gate or at least reduce the likelihood of an electrical breakdown occurring. Moreover, the sidewall spacer 301 may substantially prevent or at least reduce a tunneling current between the floating gate and the select gate. The base layer 303 may be provided with a relatively small thickness which may help to improve the controllability of a channel region of the nonvolatile memory cell. The formation of the floating gates, select gates and channel regions of the nonvolatile memory cells will be described below.

Figure 4:
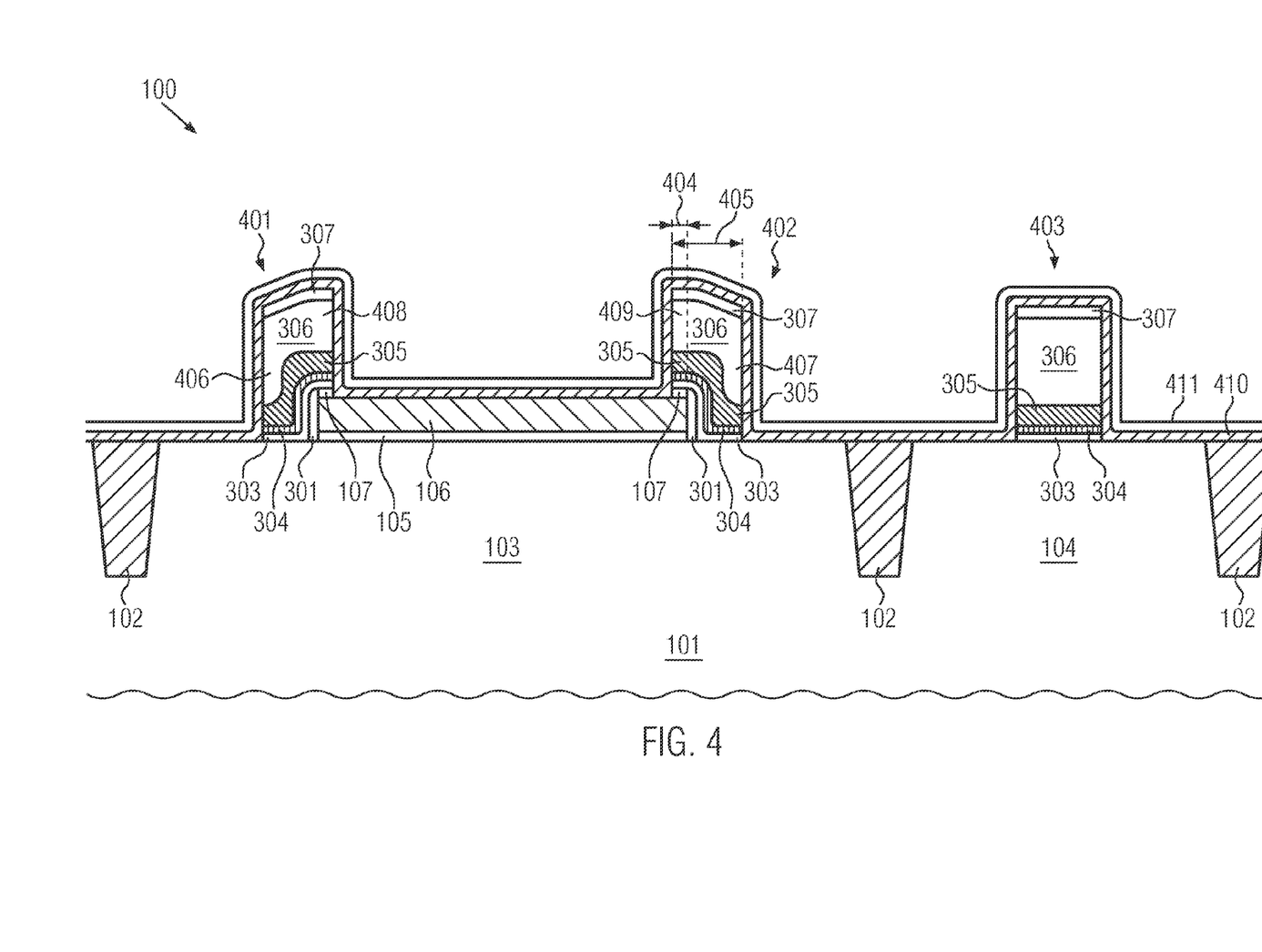

FIG. 4 shows a schematic cross-sectional view of the semiconductor structure 100 in a later stage of the manufacturing process. After the formation of the gate stack 302, the gate stack 302 may be patterned. This may be done by means of techniques of photolithography and etching that are conventionally employed in the formation of gate electrodes of field effect transistors in accordance with gate-first high-k metal gate techniques. In some embodiments, in the patterning of the gate stack 302, the capping layer 307 may be patterned by means of techniques of photolithography and etching to form a hardmask from the capping layer 307. Thereafter, a photoresist mask used in the patterning of the capping layer 307 may be removed by means of a resist strip process, and one or more etch processes adapted for removing materials of the layer 306 of semiconductor material, the metal layer 305, the layer 304 of high-k dielectric material and the base layer 303 may be performed. Portions of the layers 306, 305, 304, 303 below the hardmask formed by the patterning of the capping layer 307 may remain in the semiconductor structure 100. In the patterning of the gate stack 302, select gates 401, 402 may be formed over the nonvolatile memory region 103, and a gate 403 of a logic transistor may be formed over the logic transistor region 104. Since the select gates 401, 402 and the gate 403 of the logic transistor have each been formed from the gate stack 302, each of the select gates 401, 402 and the gate 403 of the logic transistor may include corresponding materials. In particular, each of the select gates 401, 402 and the gate 403 of the logic transistor may include a gate insulation layer including a respective portion of the layer 304 of high-k dielectric material, each of the gate insulation layers including substantially the same high-k dielectric material and a gate electrode including a respective portion of the metal layer 305, each of the gate electrodes including substantially the same metal.

In addition to the portions of the layers of the gate stack 302, in the patterning of the gate stack 302, portions of the electrically insulating layer 107 that are not arranged below the select gates 401, 402 may be removed. In particular, in embodiments wherein the electrically insulating layer 107 and the base layer 303 are both formed of silicon dioxide, portions of the base layer 303 and the electrically insulating layer 107 may be removed in a common etch process. Thus, after the patterning of the gate stack 302, the floating gate material of the layer 106 of floating gate material and the semiconductor material of the substrate 101 in the nonvolatile memory region 103 and the logic transistor region 104 may be exposed at the surface of the semiconductor structure 100.

Each of the select gates 401, 402 may include a first portion that is located adjacent the layer 106 of floating gate material and the electrically insulating layers 105, 107. In FIG. 4, the first portion of the select gate 401 is denoted by reference numeral 406, and the first portion of the select gate 402 is denoted by reference numeral 407. Additionally, each of the select gates 401, 402 may include a second portion that is located over the electrically insulating layers 105, 107 and the layer 106 of floating gate material. In FIG. 4, reference numeral 408 denotes the second portion of the select gate 401, and reference numeral 409 denotes the second portion of the select gate 402. Each of the second portions 408, 409 of the select gates 401, 402 is separated from the layer 106 of floating gate material by a portion of the electrically insulating layer 107. Furthermore, each of the first portions 406, 407 of the select gates 401, 402 may be separated from the layer 106 of floating gate material by the sidewall spacer 301. A part of the first portions 406, 407 of the select gates adjacent the respective second portion 408, 409 may be arranged over the sidewall spacer 301.

An extension of the first portions 406, 407 of the select gates 401, 402 in a direction from the select gate 401 to the select gate 402, corresponding to a channel length direction of the nonvolatile memory cells to be formed in the nonvolatile memory region 103, may be greater than an extension of the second portions 408, 409 in the channel length direction. In FIG. 4, reference numeral 404 exemplarily denotes the extension of the second portion 409 of the select gate 402 in the channel length direction, and reference numeral 405 denotes the extension of the entire select gate 402 in the channel length direction, corresponding to a sum of the extension of the first portion 407 of the select gate 402 in the channel length direction and the extension 404 of the second portion 409 of the select gate 402 in the channel length direction. In some embodiments, the extension 405 of the select gate 402 in the channel length direction may be in a range from about 60-150 nm, for example, about 100 nm. The extension 404 of the second portion 409 of the select gate 402 in the channel length direction may be in a range from about 10-40 nm, for example about 25 nm. The select gate 401 may have dimensions corresponding to those of the select gate 402.

The second portions 408, 409 of the select gates 401, 402 provide an overhang of the select gates 401, 402 over floating gate electrodes that are formed from the layer 106 of floating gate material, as described below.

Dimensions of the gate 403 of the logic transistor may correspond to dimensions of logic transistor gates that are provided in accordance with a high-k metal gate technology, for instance the 28 nm technology node.

After the formation of the select gates 401, 402 and the gate 403 of the logic transistor, an encapsulation layer 410 may be deposited over the semiconductor structure.

The encapsulation layer 410 may include silicon nitride, and it may be formed by means of molecular layer deposition. The encapsulation layer 410 may cover sidewalls of each of the select gates 401, 402 and the gate 403 of the logic transistor. The encapsulation layer 410 may be provided both at sidewalls of the first portions 406, 407 of the select gates 401, 402 which are located lateral to the layer 106 of floating gate material and at sidewalls of the second portions 408, 409 of the select gates 401, 402 which are located over the layer 106 of floating gate material. The encapsulation layer 410 may provide an encapsulation of the high-k dielectric material of the layer 304 of high-k dielectric material on both sides of the select gates 401, 402. Due to the overhang of the select gates 401, 402 over the layer 106 of floating gate material, the encapsulation layer 410 need not be arranged between the first portions of the select gates 401, 402 and the layer 106 of floating gate material, which may help to avoid topography issues that may occur in nonvolatile memory cells wherein the entire select gate is arranged adjacent the floating gate.

After the formation of the encapsulation layer 410, a layer 411 of sidewall spacer material may be deposited over the semiconductor structure 100. The layer 411 of sidewall spacer material may be formed of a material that may be etched selectively relative to the material of the encapsulation layer 410. In embodiments wherein the encapsulation layer 410 includes silicon nitride, the layer 411 of sidewall spacer material may include silicon dioxide.

Figure 5:
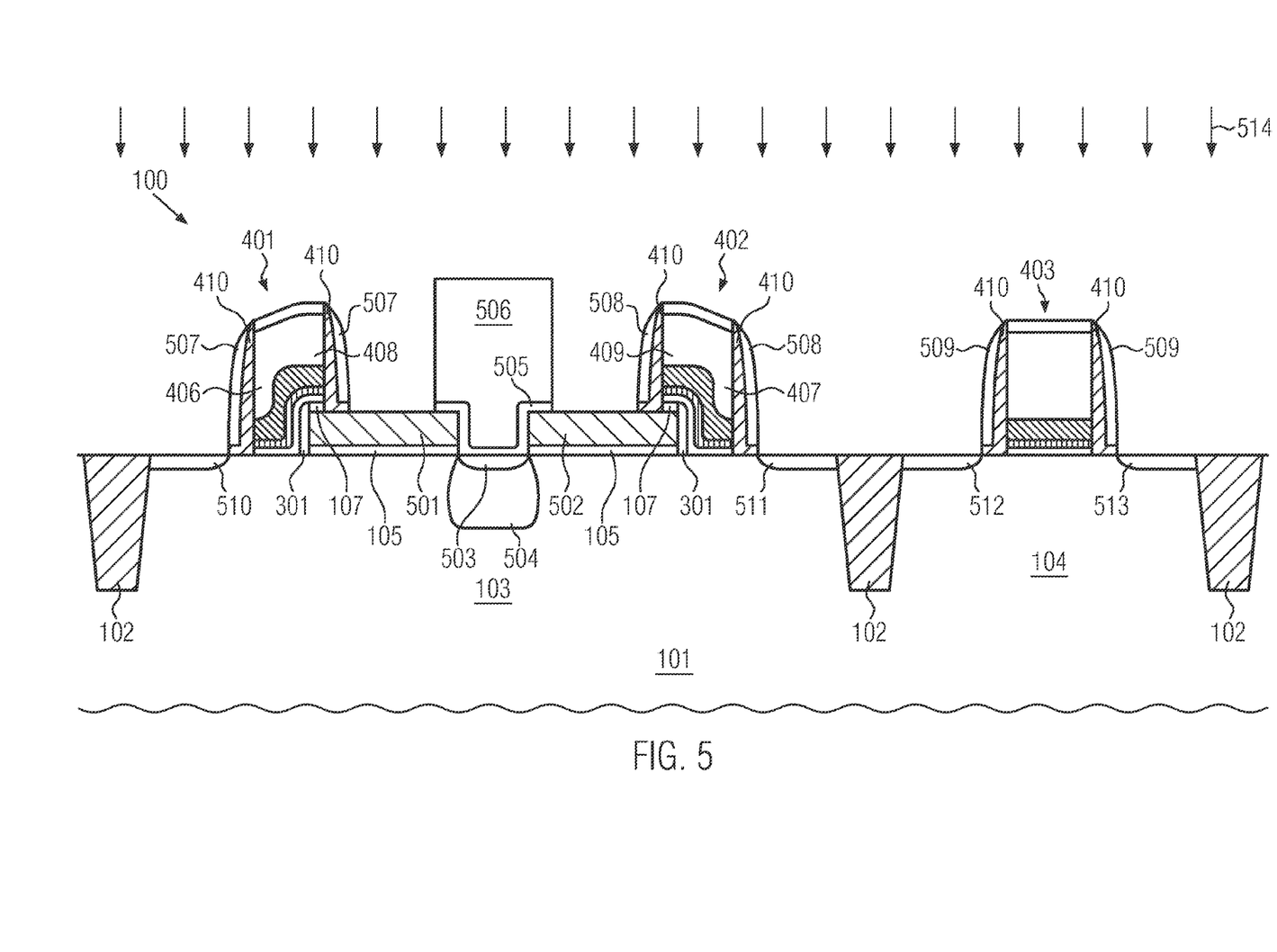

FIG. 5 shows a schematic cross-sectional view of the semiconductor structure 100 in a later stage of the manufacturing process. For clarity of illustration, in FIG. 5, some of the reference numerals of features of the semiconductor structure 100 shown in FIG. 4 have been omitted. Unless explicitly indicated otherwise, features shown in FIG. 4 whose reference numerals have been omitted in FIG. 5, and which are shown in FIG. 5, can still be present in the semiconductor structure 100 at the stage of the manufacturing process illustrated in FIG. 5.

After the deposition of the encapsulation layer 410 and the layer 411 of sidewall spacer material, a floating gate 501 and a floating gate 502 may be formed on the basis of the layer 106 of floating gate material. Each of the floating gates 501, 502 will be provided in one of the pair of nonvolatile memory cells 617, 618 (see FIG. 6) that is formed in the nonvolatile memory region 103. Adjacent the floating gates 501, 502, a source region 504 that is doped differently than portions of the semiconductor material of the nonvolatile memory region 103 below the floating gates 501, 502 and the select gates 401, 402 may be formed. Over the source region 504, an erase gate 506 may be formed. The erase gate 506 may include a semiconductor material, for example, polysilicon. The erase gate 506 may be separated from the floating gates 501, 502 by a tunneling layer 505. A portion of the tunneling layer 505 may also be provided between the erase gate 506 and the source region 504. The tunneling layer 505 may be formed of an electrically insulating material such as silicon dioxide. In some embodiments, in addition to the portion of the tunneling layer 505, an insulation region 503 may be provided between the erase gate 506 and the source region 504. The insulation region 503 may include an oxide of the semiconductor material of the substrate 101, for example, silicon dioxide.

The source region 504 provides a common source region of the nonvolatile memory cells 617, 618 that are formed in the nonvolatile memory region 103, and the erase gate 506 provides a common erase gate of the nonvolatile memory cells 617, 618.

The source region 504 and the erase gate 506 are arranged on a side of the floating gate 501 opposite to the select gate 401 and on a side of the floating gate 502 opposite to the select gate 402. As shown in FIG. 5, the erase gate 506 and the tunneling layer 505 may include portions that are arranged over the floating gates 501, 502 so that there is an overhang of the erase gate 506 and the tunneling layer 505 over the floating gates 501, 502.

In some embodiments, techniques for obtaining a self-alignment between the source region 504 and the erase gate 506 may be used in the formation of the source region 504, the insulation region 503, the tunneling layer 505 and the erase gate 506. For this purpose, a layer of a hardmask material (not shown) may be formed over the semiconductor structure 100. The layer of hardmask material may be formed of a material that may be etched selectively relative to the material of the layer 411 of sidewall spacer material. In embodiments wherein the layer 411 of sidewall spacer material includes silicon dioxide, the hardmask material may include silicon nitride. A thickness of the layer of hardmask material may be greater than the height of the erase gate 506. In some embodiments, the layer of hardmask material may be polished, for example, by means of chemical mechanical polishing, to obtain a substantially planar surface of the layer of hardmask material without bumps over the select gates 401, 402 and the gate 403 of the logic transistor, which might be caused by the topology of the select gates 401, 402 and the gate 403 of the logic transistor. The layer of hardmask material may cover the select gates 401, 402 and the gate 403 of the logic transistor so that the select gates 401, 402 and the gate 403 of the logic transistor are not exposed at the surface of the semiconductor structure 100.

The layer of hardmask material may be patterned to form a hardmask having an opening at the location where the erase gate 506 is to be formed. For obtaining the overhang of the erase gate 506 and the tunneling layer 505 over the floating gates 501, 502, a sacrificial sidewall spacer may be formed at the sidewalls of the opening of the hardmask using techniques of isotropic deposition and anisotropic etching. Then, one or more etch processes adapted for removing the materials of the layer 106 of floating gate material and the electrically insulating layer 105 may be performed. Then, the insulation region 503 may be formed using known techniques for the local oxidation of silicon (LOCOS), and an ion implantation process may be performed for forming the source region 504 by implantation of ions of a dopant into the semiconductor material of the substrate 101 in the nonvolatile memory region 103. Thereafter, the sacrificial sidewall spacer formed at the sidewalls at the opening of the hardmask may be removed, and the tunneling layer 505 may be formed using techniques of deposition and/or oxidation. Thereafter, a layer of the material of the erase gate 506, for example a polysilicon layer, may be deposited over the semiconductor structure 100, for example, by means of CVD or PECVD. Thereafter, a chemical mechanical polishing process may be performed for removing portions of the layer of the material of the erase gate 506 and/or the material of the tunneling layer 505 outside the opening of the hardmask. Then, the hardmask may be removed by means of an etch process that is adapted to selectively remove the material of the hardmask relative to the materials of the erase gate 506 and the layer 411 of sidewall spacer material.

Thereafter, an anisotropic etch process that is adapted to selectively remove the sidewall spacer material of the layer 411 of sidewall spacer material relative to the material of the encapsulation layer 410 may be performed. Portions of the layer 411 of sidewall spacer material at sidewalls of the select gates 401, 402 and the gate 403 of the logic transistor may remain in the semiconductor structure 100 due to the anisotropy of the etch process so that sidewall spacers 507, 508, 509 are formed at sidewalls of the select gates 401, 402 and the gate 403 of the logic transistor. Then, an etch process adapted to remove the material of the encapsulation layer 410 may be performed. Portions of the encapsulation layer 410 that are covered by the sidewall spacers 507, 508, 509 may remain in the semiconductor structure 100 so that the high-k dielectric materials of the select gates 401, 402 and the gate 403 of the logic transistor remain encapsulated by the encapsulation layer 410.

After the formation of the sidewall spacers 507, 508, 509, an ion implantation process that is schematically illustrated by arrows 514 in FIG. 5 may be performed. In the ion implantation process 514, the semiconductor structure 100 may be irradiated with ions of a dopant so that drain extensions 510, 511 are formed adjacent the select gates 401, 402, and a source extension 512 and a drain extension 513 are formed adjacent the gate 403 of the logic transistor.

Figure 6:
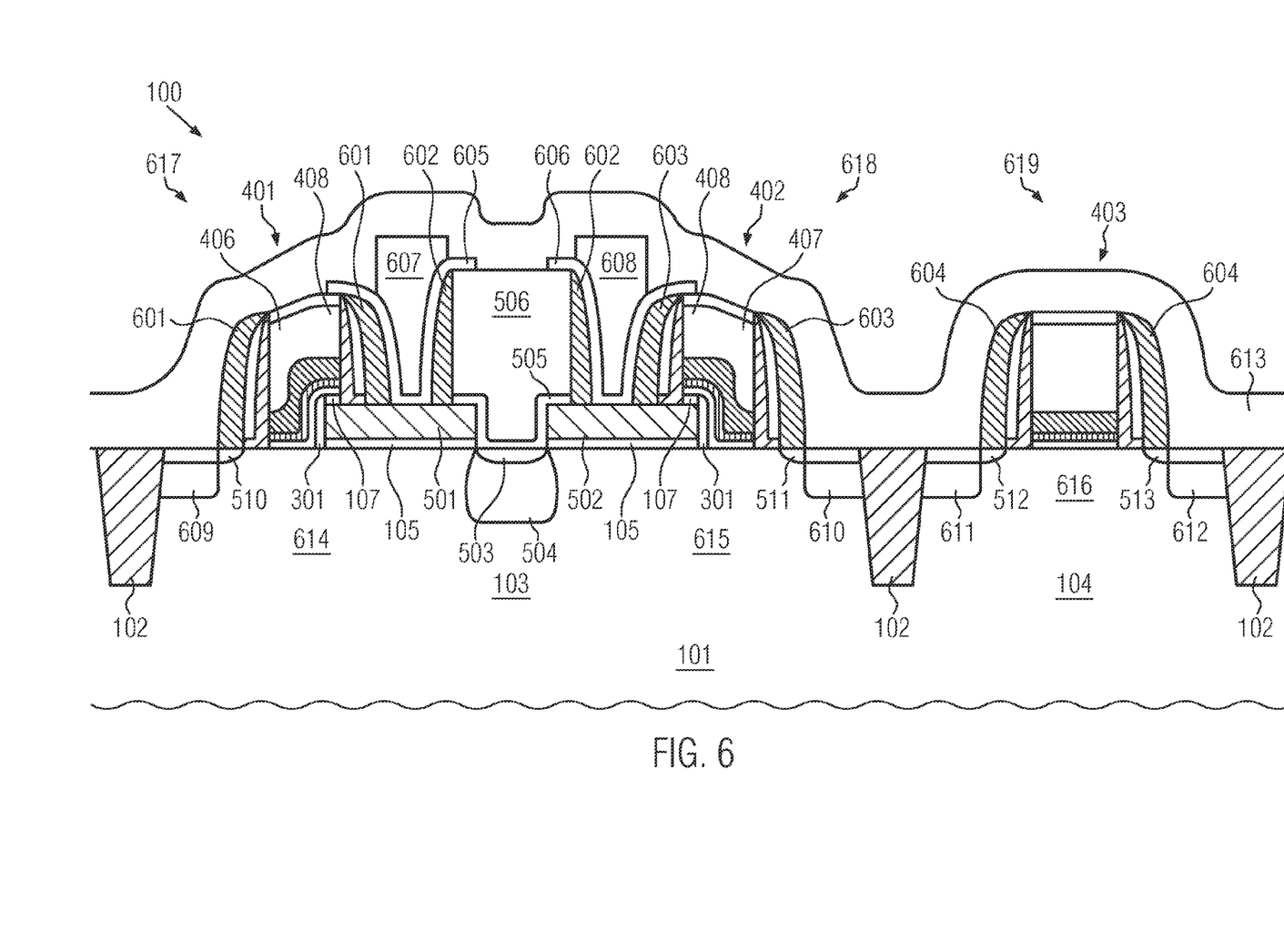

FIG. 6 shows a schematic cross-sectional view of the semiconductor structure 100 in a later stage of the manufacturing process. For clarity of illustration, in FIG. 6, some reference numerals of elements of the semiconductor structure 100 have been omitted. Unless explicitly indicated otherwise, features shown in FIG. 5 whose reference numerals have been omitted in FIG. 6, and which are shown in FIG. 6, may still be present in the semiconductor structure 100 at the stage of the manufacturing process illustrated in FIG. 6.

After the formation of the drain extensions 510, 511, the source extension 512 and the drain extension 513, a sidewall spacer 601 may be formed adjacent the select gate 401, a sidewall spacer 602 may be formed adjacent the erase gate 506, a sidewall spacer 603 may be formed adjacent the select gate 402, and a sidewall spacer 604 may be formed adjacent the gate 403 of the logic transistor. For forming the sidewall spacers 601, 602, 603, 604, a layer of a material of the sidewall spacers 601, 602, 603, 604, for example, a silicon nitride layer, may be deposited over the semiconductor structure 100, and an anisotropic etch process may be performed for removing portions of the layer of the material of the sidewall spacers 601, 602, 603, 604 over substantially horizontal portions of the semiconductor structure 100. In some embodiments, a liner layer, for example a silicon dioxide layer (not shown), may be provided below the layer of the material of the sidewall spacers 601, 602, 603, 604, which may be used as an etch stop layer.

Thereafter, an ion implantation process may be performed, wherein the semiconductor structure 100 is irradiated with ions of a dopant. Thus, drain regions 609, 610 may be formed adjacent the select gates 401, 402, and a source region 611 and a drain region 612 may be formed adjacent the gate 403 of the logic transistor. The drain regions 609, 610 and the drain extensions 510, 511 are arranged at sides of the first portions 406, 407 of the select gates 401 and 402 that are opposite to the floating gates 501 and 502, respectively.

Portions of the nonvolatile memory region 103 between the source region 504 and the drain region 609 may have a doping that corresponds to the initial doping of the nonvolatile memory region 103 and form a channel region 614 having a portion below the first portion of the select gate 401 and a portion below the floating gate 501. Portions of the nonvolatile memory region 103 between the source region 504 and the drain region 610 may have a doping that substantially corresponds to the initial doping of the nonvolatile memory region 103 and form a channel region 615 having a portion below the first portion of the select gate 402 and a portion below the floating gate 502.

In some embodiments, the source region 504, the drain regions 609, 610 and the drain extensions 510, 511 may be N-doped, and the channel regions 614, 615 may be substantially undoped or P-doped.

A portion of the semiconductor material of the logic transistor region 104 between the source region 611 and the drain region 612 may have a doping that is different from the doping of the source region 611, the source extension 512, the drain region 612 and the drain extension 513 and may form a channel region 616 below the gate 403 of the logic transistor. In some embodiments, the source region 611, the source extension 512, the drain region 612 and the drain extension 513 may be N-doped, and the channel region 616 may be P-doped or substantially undoped. Thus, an N-channel logic transistor 619, being representative of an N-channel logic transistor in a logic circuit in the semiconductor structure 100, may be provided at the logic transistor region 104.

A control gate 607 may be formed between the select gate 401 and the erase gate 506, and a control gate 608 may be formed between the select gate 402 and the erase gate 506. The control gate 607 is provided over the floating gate 501 and separated therefrom by a control gate insulation layer 605. The control gate 608 is provided over the floating gate 502 and is separated therefrom by a control gate insulation layer 606. The control gates 607, 608 may include a semiconductor material, for example polysilicon. The control gate insulation layers 605, 606 may include one or more electrically insulating materials. In some embodiments, each of the control gate insulation layers 605, 606 may include three sublayers, which include a first sublayer and a third sublayer that are formed of silicon dioxide and a second sublayer that is formed of silicon nitride and arranged between the first and the third sublayer, thus forming an arrangement which is usually denoted as an "ONO" layer stack.

In some embodiments, self-aligned techniques may be used for forming the control gates 607, 608 and the control gate insulation layers 605, 606, wherein techniques of forming a hardmask and sacrificial sidewall spacers, deposition and chemical mechanical polishing are used, similar to those described above for the formation of the tunneling layer 505 and the erase gate 506. Additionally, a dielectric layer 613, which, in some embodiments, may include silicon nitride, may be deposited over the semiconductor structure 100.

In some embodiments, silicides (not shown) may be formed in each of the drain regions 609, 610, the source region 611 and the drain region 612, for example, before the deposition of the dielectric layer 613. Additionally, silicides may be formed in the select gates 401, 402, the erase gate 506, the control gates 607, 608 and the gate 403 of the logic transistor 619. This may be done in accordance with known techniques for the formation of silicide, which include a deposition of a layer of a metal over the semiconductor structure 100 and one or more annealing processes for initiating a chemical reaction between the metal and silicon in the semiconductor structure 100. Furthermore, the manufacturing of the semiconductor structure 100 may include one or more annealing processes for activating dopants in the semiconductor structure 100.

Further features of the manufacturing process may correspond to those of known techniques for the formation of nonvolatile memory cells and/or field effect transistors.

After the completion of the steps of the manufacturing process described above, the semiconductor structure 100 includes a nonvolatile memory cell 617 and a nonvolatile memory cell 618, which are provided at the nonvolatile memory region 103. The nonvolatile memory cell 617 includes, in particular, the select gate 401, the control gate 607, the erase gate 506, the floating gate 501, the source region 504, the channel region 614 and the drain region 609. The nonvolatile memory cell 618 includes, in particular, the select gate 402, the control gate 608, the erase gate 506, the floating gate 502, the source region 504, the channel region 615 and the drain region 610 wherein, as described above, the source region 504 and the erase gate 506 are common to the nonvolatile memory cells 617, 618.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   providing a semiconductor structure comprising a semiconductor material;
   forming a layer of a floating gate material that is surrounded by at least one electrically insulating material over said semiconductor material;
   forming a gate stack over said semiconductor structure;
   patterning said gate stack, said patterning of said gate stack forming a select gate, said select gate comprising a first portion and a second portion, wherein said first portion of said select gate is provided over a portion of said semiconductor material adjacent to said layer of floating gate material and said second portion of said select gate is provided over a portion of said layer of floating gate material adjacent to said first portion of said select gate; and
   after said patterning of said gate stack, forming a control gate insulation layer above at least a portion of said select gate and forming a control gate material above said control gate insulation layer to define a control gate over a portion of said layer of floating gate material.

2. The method of claim 1, wherein said forming of said layer of floating gate material that is surrounded by said at least one electrically insulating material comprises:
   forming a first electrically insulating layer over said semiconductor material;
   depositing said layer of said floating gate material over said first electrically insulating layer;
   forming a second electrically insulating layer over said layer of said floating gate material;
   patterning said first electrically insulating layer, said layer of said floating gate material and said second electrically insulating layer, wherein a sidewall of said layer of said floating gate material is formed; and
   forming an electrical insulation at said sidewall of said layer of said floating gate material.

3. The method of claim 2, wherein said forming of said electrical insulation at said sidewall of said layer of said floating gate material comprises:
   forming a third electrically insulating layer over said semiconductor structure; and
   performing an anisotropic etch process adapted to remove a material of said third electrically insulating layer, wherein a portion of said third electrically insulating layer at said sidewall of said layer of said floating gate material remains in said semiconductor structure and forms a sidewall spacer at said sidewall of said layer of floating gate material, said sidewall spacer providing said electrical insulation.

4. The method of claim 3, wherein said gate stack comprises a layer of a gate insulation material having a dielectric constant that is greater than a dielectric constant of silicon and a metal layer over said layer of gate insulation material.

5. The method of claim 4, wherein said patterning of said gate stack additionally forms a gate of a logic transistor from said gate stack.

6. The method of claim 5, wherein said gate stack further comprises a polysilicon layer over said metal layer.

7. The method of claim 6, further comprising:
after said patterning of said gate stack, forming an encapsulation layer over said semiconductor structure, said encapsulation layer comprising a portion at a sidewall of said select gate.

8. The method of claim 7, wherein said forming of said encapsulation layer comprises performing a molecular layer deposition of silicon nitride.

9. The method of claim 8, further comprising:
providing a floating gate on the basis of said layer of floating gate material;
forming a source region on a side of said floating gate opposite said select gate; and
forming a drain region on a side of said select gate opposite said floating gate.

10. The method of claim 9, further comprising forming an erase gate over said source region.

11. A method, comprising:
providing a semiconductor structure comprising a semiconductor material;
forming a layer stack comprising one or more electrically insulating layers and a layer of floating gate material over a first portion of said semiconductor material;
forming a sidewall spacer comprising an electrically insulating material at a sidewall of said layer stack;
after said forming of said sidewall spacer, forming a gate stack over said semiconductor structure;
patterning said gate stack, said patterning of said gate stack forming a select gate, wherein at least a first portion of said select gate is provided over a second portion of said semiconductor material adjacent to said layer stack; and
after said patterning of said gate stack, forming a control gate insulation layer above at least a portion of said select gate and forming a control hate material above said control gate insulation layer to define a control gate over a portion of said layer of floating gate material.

12. The method of claim 11, wherein said sidewall spacer comprises silicon dioxide.

13. The method of claim 12, wherein said select gate further comprises a second portion provided over a portion of said layer stack that is adjacent to said first portion of said select gate.

14. The method of claim 1, further comprising:
forming a source region on a side of said floating gate opposite said select gate;
forming a drain region on a side of said select gate opposite said floating gate;
forming an erase gate over said source region, wherein a cavity is defined between the erase gate and the select gate; and
forming said control gate in said cavity.

15. The method of claim 11, further comprising:
forming a source region on a side of said floating gate opposite said select gate;
forming a drain region on a side of said select gate opposite said floating gate;
forming an erase gate over said source region, wherein a cavity is defined between the erase gate and the select gate; and
forming said control gate in said cavity.

* * * * *

UNITED STATES PATENT AND TRADEMARK OFFICE
CERTIFICATE OF CORRECTION

PATENT NO. : 9,711,513 B2  
APPLICATION NO. : 14/918048  
DATED : July 18, 2017  
INVENTOR(S) : Alban Zaka et al.

Page 1 of 1

It is certified that error appears in the above-identified patent and that said Letters Patent is hereby corrected as shown below:

In the Claims

Column 18, Line 3, change "hate" to -- gate --.

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*